United States Patent
Westkamp et al.

(10) Patent No.: US 11,099,215 B2
(45) Date of Patent: Aug. 24, 2021

(54) SENSOR WITH DISCRETE IMPEDANCE ELEMENTS FOR HIGH VOLTAGE CONNECTORS

(71) Applicant: 3M INNOVATIVE PROPERTIES COMPANY, St. Paul, MN (US)

(72) Inventors: Harald Westkamp, Hattingen (DE); Bernd Schubert, Cologne (DE); Mark Gravermann, Erkelenz (DE); Jens Weichold, Erkelenz (DE)

(73) Assignee: 3M Innovative Properties Company, St. Paul, MN (US)

( * ) Notice: Subject to any disclaimer, the term of this patent is extended or adjusted under 35 U.S.C. 154(b) by 0 days.

(21) Appl. No.: 16/646,428

(22) PCT Filed: Sep. 28, 2018

(86) PCT No.: PCT/IB2018/057567
§ 371 (c)(1),
(2) Date: Mar. 11, 2020

(87) PCT Pub. No.: WO2019/064265
PCT Pub. Date: Apr. 4, 2019

(65) Prior Publication Data
US 2020/0278381 A1  Sep. 3, 2020

(30) Foreign Application Priority Data

Sep. 28, 2017  (EP) .................................... 17193719

(51) Int. Cl.
*G01R 15/06* (2006.01)
*G01R 1/20* (2006.01)
*G01R 15/16* (2006.01)
*G01R 15/18* (2006.01)
*H01R 13/66* (2006.01)

(52) U.S. Cl.
CPC ............... *G01R 15/06* (2013.01); *G01R 1/20* (2013.01); *G01R 15/16* (2013.01); *G01R 15/18* (2013.01); *H01R 13/6683* (2013.01)

(58) Field of Classification Search
None
See application file for complete search history.

(56) References Cited

U.S. PATENT DOCUMENTS

| | | | |
|---|---|---|---|
| 10,534,020 B2 | 1/2020 | Hetzler | |
| 2006/0170432 A1* | 8/2006 | Adolfsson | G01R 15/16 324/658 |

(Continued)

FOREIGN PATENT DOCUMENTS

| | | |
|---|---|---|
| CN | 202034575 | 11/2011 |
| DE | 204855621 | 12/2015 |

(Continued)

OTHER PUBLICATIONS

Abb, "KEVA C Indoor voltage sensors for Nexans separable connectors", Nov. 23, 2016, 7 pages.

(Continued)

*Primary Examiner* — Jas A Sanghera
(74) *Attorney, Agent, or Firm* — Gregg H. Rosenblatt

(57) ABSTRACT

The invention relates to a sensor (3) for measuring a voltage in a HV/MV power network in a separable connector (2), the sensor comprising: —an adapter element (11) comprising a high voltage connection adapted to be mechanically and electrically coupled to a high voltage conductor (7) of the separable connector (2) and to receive HV/MV voltage from the separable connector, —a sensor body (12) adapted to be mechanically and electrically coupled to the adapter element (11) and comprising a divider assembly (24) with a plurality of discrete impedance elements, which are electrically connected in series such as to be operable as a voltage divider for sensing a voltage and a low voltage connection (42)

(Continued)

configured to provide a low voltage signal corresponding to a high voltage signal present in the HV/MV power network, wherein the adapter element (11) and the sensor body (12) are separate elements that are adapted to be installed to the separable connector (2), wherein the adapter element is configured to be installed between the separable connector and the sensor body.

17 Claims, 9 Drawing Sheets

(56) References Cited

U.S. PATENT DOCUMENTS

| | | | |
|---|---|---|---|
| 2014/0346023 A1 | 11/2014 | Siebens | |
| 2016/0134094 A1 | 5/2016 | Wentzel | |
| 2018/0246146 A1* | 8/2018 | Rohde | G01R 15/16 |

FOREIGN PATENT DOCUMENTS

| | | |
|---|---|---|
| EP | 1302685 | 4/2003 |
| EP | 1564418 | 8/2005 |
| EP | 2605023 | 6/2013 |
| EP | 3147675 | 3/2017 |
| EP | 2728365 | 5/2017 |
| EP | 3203245 | 8/2017 |
| WO | WO 2002-080308 | 10/2002 |

OTHER PUBLICATIONS

Eaton, "Line installation and protective equipment master catalog 5 kV-35 kV electrical distribution systems", 2016, 68 pages.

Eaton, "25 kV class fused loadbreak elbow connector", Product Brochure, Dec. 2015, 8 pages.

International Search report for PCT International Application No. PCT/IB2018/057567 dated Jan. 23, 2019, 4 pages.

* cited by examiner

SENSOR WITH DISCRETE IMPEDANCE ELEMENTS FOR HIGH VOLTAGE CONNECTORS

The invention relates to a sensor for measuring a voltage in a high voltage or medium voltage (HV/MV) power network present in a separable connector. The invention also relates to a power network comprising a HV/MV power conductor, a separable connector as well as a sensor according to the invention.

As electrical power distribution becomes more complex through the advent of renewable energy, distributed generation and intelligent electrical distribution and associated electrical sensing is becoming more useful and even necessary. Useful sensing may include the sensing of voltage, current, and also displaying a relationship between voltage and current at various locations within a power distribution network.

Many existing relatively high voltage transformers and switchgears have a dedicated but limited space for cable accessories, particularly in higher voltage applications (for example, 5 kV to 69 kV, or higher). Such cable accessory connections are sometimes referred to as separable connectors such as for examples elbows or T-bodies. These cable accessory connections may provide space for so-called plugs, plug-ins or rear inserts.

Many cable accessories implement test points to provide a scaled fraction of the line voltage residing on the shielded and insulated conductor for the cable accessory. The historical use of these test points is for indication of the presence of line voltage at the transformer or switchgear. Often, these test points do not provide the voltage ratio accuracy required for modern grid automation power quality and control applications, which may be for example plus, minus 0.5 Volt.

Other challenges of measuring a voltage at cable accessories may for example be limited space in high voltage transformers and switchgears. Furthermore, because of the high voltage application and the shielded and insulated conductors that are used, special requirements are necessary to provide the needed safety. One important aspect in this context is that voids and other spaces, where air between parts of the assembly can be entrapped, need to be avoided. Also, it is important to have all necessary parts adequately shielded. A further important aspect is to provide an easy to install sensor solution.

In this context EP 2 605 023 A1 discloses a resistive voltage divider housed inside a plug-in connector which can be plugged into a high voltage power distribution cell. The resistive voltage divider comprises a plurality of resistive elements supported by a dielectric arranged in a zig-zag shape. The resistive voltage divider can be used for measuring a voltage in a high voltage application.

As another example DE 10 2015 000 301 discloses a separable connector for a HV/MV power network with an integrated sensor assembly.

In view of the above described situation there is still a need to provide a simple alternative solution for measuring a voltage in a MV/HV application that provides measuring results of a certain accuracy, that also provides a save system and that is easy to install.

The present invention provides a sensor for measuring a voltage in a high voltage or medium voltage (HV/MV) power network in a separable connector, the sensor comprising:
  an adapter element comprising a high voltage connection adapted to be mechanically and electrically coupled to a high voltage conductor of the separable connector and to receive HV/MV voltage from the separable connector;
  a sensor body adapted to be mechanically and electrically coupled to the adapter element and comprising a divider assembly with a plurality of discrete impedance elements, which are electrically connected in series such as to be operable as a voltage divider for sensing a voltage and a low voltage connection configured to provide a low voltage signal corresponding to a high voltage present in the HV/MV power network;
  wherein the adapter element and the sensor body are separate elements that are adapted to be installed to the separable connector, wherein the adapter is configured to be installed between the separable connector and the sensor body.

Thus, the invention provides a sensor with at least two separate elements, wherein at least one of them comprises a divider assembly for measuring a voltage in a HV/MV power network with a required accuracy. One element, e.g. an adaptor element, comprises a high voltage connection adapted to be mechanically and electrically coupled to a high voltage conductor of the separable connector to receive HV/MV voltage. Another element, e.g. a sensor body, comprises means for mechanically and electrically coupling to the adaptor element and a divider assembly for measuring the voltage. The sensor according to the invention can for example be used as an insulating plug or rear insert for the separable connector of the power network as well.

A sensor comprising two separate elements that are adapted to be installed to a separable connector, wherein a first element is installed between the separable connector and a second element, provides installation or mounting advantages. Mounting plugs or rear inserts into or onto a separable connector may provide several challenges, such as for example the limited space provided in voltage transformers or switchgears. Another challenge may be the force needed to mount a plug or rear insert such that no air is entrapped, especially if the separable connector and/or the plug or rear insert is or are made out of rigid insulating material(s). For assuring a secure and safe connection, a certain contact or surface pressure between the parts to be mounted onto the separable connector may be required. This might be especially challenging for retro-fit solutions, where the space that the separable connectors provide for plugs or rear inserts is not standardized and may differ in its shape and/or dimension.

Providing now a sensor with two separate elements may allow to install a first element, e.g. the adaptor element—which may provide limited dimensions—such that no air is entrapped between the separable connector and the adaptor element of the sensor. If the adaptor element provides limited dimensions it may also be possible to fix it with common movements, such as for example with a rotational movement. With a smaller element it may also be the case that it is easier to bring up the required surface or contact pressure between the separable connector and the sensor. If the adaptor element is configured to be installed between the separable connector and a sensor body it may be that the interface (interface meaning the contacting surfaces of the adapter element and the sensor body touching or contacting each other in the installed state) between the adapter element and the sensor body is designed such that the installation step to add the sensor body to the adaptor element is an easy one. This may for example be achieved by providing contacting surfaces with different rigidity, e.g. the adapter provides a rigid surface and the sensor body provides a surface that is more flexible than the surface of the adapter. If the sensor body directly contacts the separable connector, it is also possible that the contacting surface of the sensor body is more rigid than the separable connector.

According to the inventive scenario, the sensor body may have a shape and dimension that is bigger than the dimension of the adapter element. The mounting method between the adapter element and the sensor body may be selected such that no rotation of the bigger or elongated sensor body is necessary, which allows an installation of the sensor, even with extended dimensions in limited space conditions as well.

The term high or medium voltage as used herein means a voltage equal to or greater than a high voltage threshold. The high voltage threshold may be based on a standard, jurisdictional requirement, or end-user requirement that applies to the particular system being described. For example, high or medium voltage may refer to operating at about the voltage rating defined in a standard, such as for example the Institute of Electrical and Electronics Engineers (IEEE) Standard 386 (2016) for separable insulated connector systems for power distribution systems rated 2.5 kV through 35 kV (classified as phase-to-phase root-mean-square, or rms). Depending on the application, the medium or high voltage threshold may be equal to or greater than about 2.5 kV, about 3 kV, about 15 kV, about 25 kV, about 28 kV, about 35 kV, about 52 kV, about 69 kV, or more (classified as phase-to-phase rms).

The term low voltage as used herein means a voltage that is less than the medium or high voltage. Low voltage may be defined at or below a low voltage threshold. The low voltage threshold and the medium or high voltage threshold may be the same threshold or a different threshold. A low voltage may be a fraction, or ratio less than 1, of a medium or high voltage. The low voltage may be defined by the threshold fraction, or ratio (for example, less than or equal to about 1:100). Unless otherwise stated in the disclosure herein, low voltage is described using phase-to-ground rms. Depending on the application, the low voltage threshold may for example be equal or smaller than about 1 kV.

The separable connector as used herein means a connection or interface for a high voltage system that can be readily established or broken by engaging or separating the connection at an operating interface. Separable connectors may be fully insulated and shielded and used to terminate and insulate a power cable, insulate another electrical component, or connect an insulated power cable to electrical apparatus, other power cables, or both. Separable connectors may be connected to transformers or switchgears. Some separable connectors may be used for dead-front transformers and switchgears, which refer to having no exposed high voltage surface in the connector between a power cable and the transformer or switchgear in the power utility industry. Non-limiting examples of separable connectors include elbow separable insulated connectors and t-separable insulated connectors (for example, a t-body).

The high voltage conductor of the invention is the electrical conductor of the HV/MV power network that is inserted into the separable connector and that carries the voltage of the HV/MV power network. It may also carry a medium voltage but will be called high voltage conductor within this patent application.

The term connection as used herein means an interface, a connector, or other structure used to electrically and/or mechanically couple components. For example, a connection may include a plug or socket, a wire, a cable, a conductor on a substrate, a piece of solder, a conductive via, or other similar electrical and/or mechanical coupling.

The terms coupled or connected refer to elements being attached to each other either directly (in direct contact with each other) or indirectly (having one or more elements between and attaching the two elements).

The divider assembly according to the present invention may comprise a plurality of (e.g. two, three or more) discrete impedance elements which are electrically connected in series such as to be operable as a voltage divider for sensing a voltage, e.g. a voltage present in the HV/MV power network. The plurality of discrete impedance elements may be mechanically connected in series, e.g. such as to form a chain. The voltage divider may be positioned between an inner conductor of the power conductor and low voltage or electrical ground. It may be electrically connected with both, the power conductor and low voltage or electrical ground. An impedance element may be, for example, a resistor, a capacitance or an inductance. A plurality of discrete impedance elements may comprise one resistor and one or more capacitors. A plurality of discrete impedance elements may comprise one resistor and one or more inductances. A plurality of discrete impedance elements may comprise one inductance and one or more capacitors. Generally, the plurality of discrete impedance elements may comprise one or more resistors, and/or one or more capacitors and/or one or more inductances. Resistors, capacitors and inductances are particularly suitable elements to form a voltage divider, because they are readily available at moderate cost. Also, their electrical properties are generally precisely specified.

The divider assembly may be rigid. This may facilitate pushing the divider assembly into a cavity of the sensor body of the invention. Alternatively the divider assembly may be to some extend flexible, e.g. bendable. The divider assembly may comprise a printed circuit board ("PCB") on which the plurality of discrete impedance elements is arranged. The PCB may be flexible or rigid. The plurality of discrete impedance elements are be connected in series such as to be operable as a voltage divider. They may be electrically connected by wires or by conductive traces on a PCB or by soldering material. Each impedance element may comprise two contacts for connecting it electrically.

A first impedance element of the plurality of discrete impedance elements may have a high-voltage contact for electrical connection direct or indirect to a component of the power conductor or high-voltage, e.g. to a high voltage conductor of the separable connector. Where the divider assembly has an elongated shape comprising a first end portion and an opposed second end portion, the high voltage contact may be arranged at the first end portion of the divider assembly.

A second impedance element of the plurality of discrete impedance elements may have a low-voltage contact for electrical connection to low voltage or to electrical ground. Generally, the low-voltage contact may be arranged such as to be accessible for electrical contacting from outside the sensor body. Where the divider assembly has an elongated shape comprising a first end portion and an opposed second end portion, and where the high voltage contact is arranged at the first end portion, the low voltage contact may be arranged at the second end portion of the divider assembly. A ground wire may be electrically connected to the low voltage contact for making the voltage of the low voltage contact available outside of the sensor body.

The divider assembly may comprise a midpoint access contact for picking up a divided voltage from the plurality of discrete impedance elements. The midpoint access contact may be electrically arranged between the first and the second impedance element. A signal wire may be electrically connected to the midpoint access contact for making the voltage of the midpoint access contact available outside of the sensor.

The plurality of discrete impedance elements connected in series may be arranged in a straight chain. Since the voltage along the plurality of impedance elements generally drops from the high voltage contact to the low voltage contact, a linear chain geometry provides for a maximum distance between two discrete impedance elements that are on different voltages and thereby reduces the risk of electrical discharges between impedance elements or between conductive wires or traces connecting the impedance elements with their respective neighbours. Alternatively, the plurality of discrete impedance elements may be arranged in a z-shaped chain or, generally, in a folded chain. Such a geometrical arrangement may provide for more flexibility in the construction of the divider assembly. Under some circumstances, this geometry may keep the extension of the divider assembly short. Any other arrangements of the impedance elements is possible as well, such as for example a spiral. In particular, the plurality of discrete impedance elements may be arranged in a linear chain of a flexible PCB, which PCB may be wound upon itself in a spiralling geometry. The wound-up PCB may be arranged in a cavity of the sensor body coaxially around a receiving space.

The divider assembly may comprise an encapsulation body in which the plurality of discrete impedance elements may be encapsulated or embedded. The encapsulation body may form the sensor body of the invention. Encapsulating the impedance elements in an encapsulation body may provide additional electrical insulation of the impedance elements against each other and against the remainder of the sensor. The encapsulation body may also provide additional protection of the impedance elements against mechanical impacts like abrasion or chemical or environmental impacts. The encapsulation may consist of a resin. The resin may be hardened resin.

According to one embodiment of the invention, the sensor comprises an insulting material and is configured to be inserted into a separable connector to encase the high voltage conductor of the separable connector. The insulating material may be provided by the adapter element and/or by the sensor body. The insulating material may cover parts or the entire surface of the adapter element and/or the sensor body. In the context of the invention to encase can also be interpreted as to surround, envelope or otherwise function as insulating plug for the separable connector carrying a high voltage conductor. In other words, the sensor may also function as an insulating plug that is free of exposed high voltage surfaces when inserted into the separable connector. Thus, the sensor according to the invention provides two functions, one is the sensing function and the other is the insulating function.

According to another embodiment of the invention, the adapter element of the sensor may comprise a metal part for making electrical and mechanical connection to the high voltage conductor of the separable connector. The adapter element may also comprise any other material that is capable of making an electrical and mechanical connection to the high voltage conductor of the separable connector. It is also possible, that the adapter element is made out of insulating material and comprises a coating, insertion or any other portion of electrically conductive material in order to provide a electrical connection to the conductor of the separable connector as well as to the sensor body. In order to be able to function as a sensor an electrical connection between the sensor body and the high voltage conductor is essential. Therefore, it is a requirement that the adaptor element provides an electrical connection to the high voltage conductor of the separable connector. This may for example be realized by making the entire adapter out of metal or by providing a metal part in the adapter element. The metal part of the adapter element provides a high voltage connection in two directions: the direction of the conductor of the separable connector as well as the direction of the sensor body. This high voltage connections need to be adapted such that it may transfer high voltage to other elements on both sides of the adapter, e.g. the sensor body with the divider assembly and/or the conductor of the separable connector.

The mechanical connection between the conductor of the separable connector and the adapter may, for example be established through a screw connection. The separable connector usually provides the screw part, which is electrically connected with the high voltage conductor of the HV/MV power network. Thus, the adapter element may provide a thread or threaded part that is adapted to cooperate with the screw of the separable connector. The adapter element may for example be connected to the separable connector by rotating it onto the screw part of the separable connector. The thread may be made out of metal or any other electrically conductive material. It may also be made out of any other material as long as the electrical connection between the high voltage conductor of the separable connector and the sensor is established that is able to transfer a high voltage. According to one embodiment the metal part of the adapter may provide the thread for being threaded onto or into the separable connector. The thread of the metal part may provide for a mechanical and an electrical connection.

In addition, the adapter element of the sensor according to the invention may also comprise a protrusion for cooperating with or receiving any kind of tool for threading the adapter element onto or into the separable connector. The protrusion may for example be a hex-shaped protrusion adapted to receive any kind of standard tools with a complementary hex-shaped receptacle. The protrusion may also be any other kind of standardized protrusion that may receive a standard tool. The protrusion may be part of the metal part or it may be part of any other part of the adapter element. According to one embodiment, the metal part of the adapter element may provide both a thread and a protrusion.

The adaptor element may further comprise means for mechanically and electrically connecting the adapter element to the sensor body. Any kind of mechanical fastening means are suitable for mechanically connecting the adapter element with the sensor body, such as screws, nuts, bolts, rivets, snap fit or clamping solutions or knee levers. The adapter element and also the sensor body may provide suitable receiving elements for those mechanical fastening means. The interface between the adapter element and the sensor body may be designed such, that the mounting or installing process is simplified. Mounting of the sensor element onto the adapter element may for example be handled with only one hand and without the need of using further tools. Possible embodiments of such simplified solutions will be described below. One additional aspect of the invention is that the surfaces of the adapter element and the sensor body that touch each other in the mounted state are designed such, that no air will be entrapped between the interface or touching areas of the two elements after the mounting process or installation.

The adapter element of the sensor for measuring a voltage according to the invention may further an insulating element, which is sized and shaped such to fit into a recess of the separable connector. The insulating element may provide a congruent shape as the recess or cavity of the separable connector that holds the sensor according to the invention. With such a construction, the sensor according to the invention may be inserted such into the recess, that the adapter element touches the inner surface of the recess. By selecting an optimized material combination from separable connector and adapter, it is possible to ensure that no air is entrapped between the separable connector and the adapter of sensor. One example of a good material combination is to make one element rigid and the other flexible. The insulating element may for example be made out of ceramic or plastic, such as for example epoxy. If the insulating element is made out of a rigid material, installation is okay, when the separable connector provides a flexible material that builds the recess. In such a situation the separable connector is able to adapt its shape according to the shape and the dimensions of the adapter element, so that no air is being entrapped after installation. It is also possible that the adapter element is dimensioned such, that it does not touch the inner walls of the recess but is small enough to be inserted into it without touching the inner walls.

The sensor body of the sensor for measuring a voltage according to the invention may comprise a conductor that is adapted to be mechanically coupled to the metal part of the adaptor element. The conductor of the sensor body may transfer the voltage of the high voltage conductor of the separable conductor that is transferred through the adaptor element by the metal part. The voltage of the high voltage conductor may be conducted through the conductor of the sensor to the divider assembly, e.g. to the high voltage end of the divider assembly. The conductor may have any kind of shape and size as long as it is capable of transferring a high voltage to the divider assembly.

According to a further embodiment of the invention, the sensor body of the sensor for measuring a voltage may comprise an insulating element carrying the conductor as well as the divider assembly. Providing an insulating element carrying the conductor as well as the divider assembly may provide the advantage that the entire sensing assembly is insulated. It also is a solution for insulating the high voltage conductor in the separable connector.

It is also possible that the insulating element of the sensor body comprises an outer elastic surface adapted in its size and shape to an inner surface of the receiving area, recess or cavity of the adapter element and/or the separable connector. The elastic surface may cover the entire sensor body or only those parts that are inserted into the receiving area of the adapter element. The inner surface according to the invention is the surface of the adapter element that is directly in contact with or is directly touching the outer surface of parts of the sensor body in an installed state of the inventive sensor. An elastic surface of the sensor body at least where it touch the adapter element in an installed state may enable an easy installation of the sensor body onto the adapter element since the shape of the sensor body may adapt to the shape of the adapter element. If the adapter element is made out of a rigid material as described above, the flexible material on the surface of the sensor body enables an easy installation and prohibits that air is being entrapped between the touching surfaces of the two elements of the sensor for measuring a voltage according to the invention.

The sensor body of the sensor for measuring a voltage may comprise an elongated handle portion. The handle portion of the sensor element may hold the divider assembly. An elongated portion at the sensor body may provide the advantage that it is easy to integrate the divider assembly with a plurality of discrete impedance elements. As already laid out above, it may be advantageous to arrange the discrete impedance elements in a linear chain geometry, because this provides for a maximum distance between two discrete impedance elements that are on different voltages. The risk of electrical discharges between impedance elements or between conductive wires or traces connecting the impedance elements with their respective neighbours is thereby reduced. The elongated handle portion extends out of the separable connector and does not need to provide an elastic outer surface.

An elongated sensor body is easy to install even when only limited space is available, if the adapter element according to the invention is installed first and provides according fastening means that do not require a rotation of the elongated sensor body.

The sensor body of the sensor for measuring a voltage according to the invention may comprise means for mechanically and electrically connecting the sensor body to the adapter element. The means for mechanically connecting the sensor body to the adapter element should be congruent to the means for mechanically connecting the adapter element to the sensor body described above. Any kind of mechanical fastening means are suitable for connecting the sensor body with the adapter element such as screws, nuts, bolts, rivets, snap fit or clamping solutions or knee levers. The interface between the sensor body and the adapter element may be designed such, that the mounting or installing process is simplified. Mounting of the sensor body onto the adapter element may for example be handled with only one hand. Possible embodiments of such simplified solutions will be described below. One additional aspect of the invention is that the surfaces of the adapter element and the sensor body that touch each other in the mounted state are designed such, that no air will be entrapped after the mounting process or installation. This can for example be achieved by selecting the materials of the different elements such that a rigid element is always arranged next to a flexible element. The flexible element may adapt its shape to the shape of the rigid element so that no air is being entrapped between the two elements.

According to another embodiment, the sensor for measuring a voltage according to the invention comprises a bayonet base to be mounted on the adapter element of the sensor, the bayonet base comprising bayonet slots. The bayonet base may be a separate element besides the adapter element and the sensor body and may be designed such to be mounted between the adapter element and the sensor body. The bayonet base may for example be mounted to the adapter element with any kind of known fastening elements, such as for example screws, screws, nuts, bolts, rivets or snap fit. It may also be threaded onto the adapter element. The sensor body of the sensor for measuring a voltage according to the invention may comprise pins for engaging with the slots of the bayonet base.

The bayonet base may provide bayonet slots, being part of a bayonet mount, which is a standard mechanical connecting mechanism consisting of a cylindrical male side with one or more radial pins and a female receptor with matching slots. The slots may be L-shaped, for example like a capital letter L with a serif, a short upward segment at the end of the horizontal arm of the L. To connect the two parts, the pin(s) of the male part may slide into the vertical arm of the L-shaped slots. After partially rotating the parts relative to each other, the pin(s) may be moved along the horizontal arm of the L-shaped slot and then be pushed into the serif.

The force to push the pin(s) into the horizontal arm of the L-shaped slot may in the invention be achieved by the flexible material of the separable connector pushing against either the adapter element or the sensor body. These kind of connecting mechanisms are, for example known from connecting a lens to a camera or from certain light bulb fittings. A bayonet connection between the sensor body and the adapter element or bayonet base provides the advantage that no large movement of the sensor body is necessary when installing the sensor. This allows an elongated extension of the sensor body even when the place where it needs to be installed is not very large.

The adapter element of the sensor for measuring a voltage according to the invention may comprise a multisided pin for engaging with a multisided hole in the bayonet base. This kind of connection ensures that no rotation is possible between the adapter element and the bayonet base of the sensor. The number of sides on the pin and on the hole may not be identical. It is for example possible to provide 18 sides on the outside of the pin and 6 sides on the inside of the hole. Any other kind of mechanical solution that prohibit a rotation between the two elements is possible as well.

The invention also relates to a power network comprising a HV/MV power conductor, a separable connector as well as a sensor according to the above description.

The invention will now be described in more detail with reference to the following Figures exemplifying particular embodiments of the invention:

Herein below various embodiments of the present invention are described and shown in the drawings wherein like elements are provided with the same reference numbers.

Figure 1:
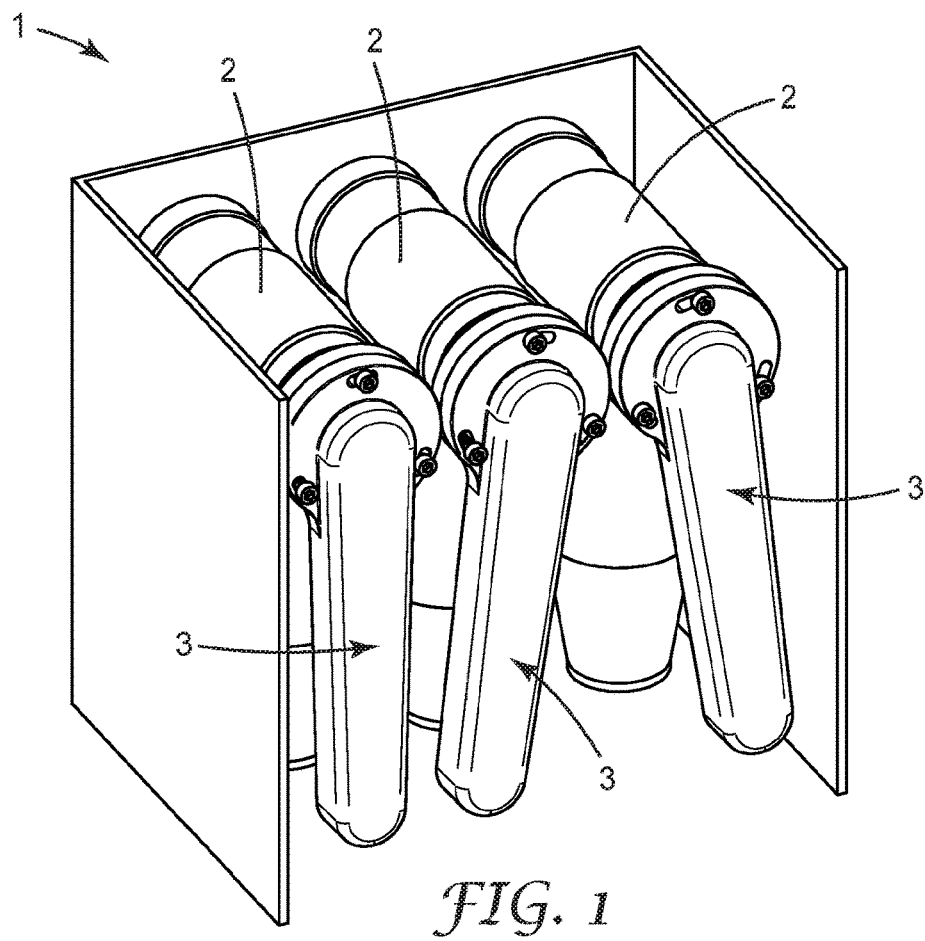
FIG. 1 is a three dimensional view of three separable connectors in a chamber of a transformer or switchgear with a first embodiment of a sensor for measuring a voltage in a HV/MV power network according to the invention.

FIG. 1 schematically shows a chamber 1 of a transformer or switchgear with three separable connectors 2. The separable connectors 2 are t-bodies providing one extension for receiving a conductor of a high voltage/medium (HV/MV) voltage power network as well as two additional extensions, one for receiving a sensor 3. The three sensors 3 in the chamber 1 provide a plug-in portion as well as an elongated handle portion as will be explained in more detail with reference to FIGS. 2, 3 and 4.

Figure 2:
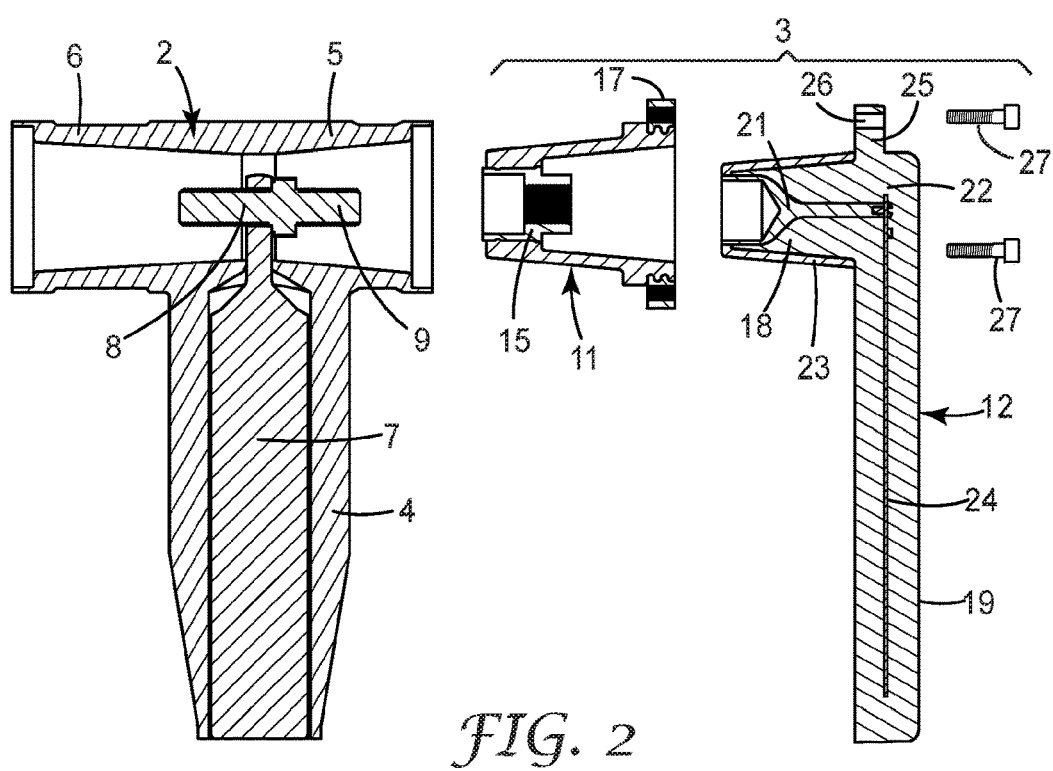
FIG. 2 is an exploded cross-sectional view of a separable connector together with the sensor of FIG. 1.

FIG. 2 shows an exploded cross-sectional view of a separable connector 2 together with a sensor 3 as shown in FIG. 1. The separable connector 2 is a t-body with a first extension 4 with a cavity for receiving a conductor 7 of a HV/MV voltage power network. The conductor 7 is only shown schematically in FIG. 2. It makes electrical and mechanical connection to a metal connection element 8. The metal connection element 8 provides at least one threaded end 9. The separable connector 2 also provides a second extension 5 with a cavity for receiving a plug or rear insert. The treaded end 9 of the connection element 9 is arranged in the extension 5. The second extension 5 can be used for receiving a sensor 3 according to the invention. The separable connector 2 finally provides a third extension 6 with a cavity for receiving a bushing from the transformer or switchgear.

The sensor 3 according to the embodiment shown in FIG. 1 provides an adapter element 11 and a sensor body 12. The adaptor element 11 and the sensor body 12 are two separate elements that are adapted to be installed to the separable connector 2 wherein the adapter element 11 is configured to be installed between the separable connector 2 and the sensor body 12. The adapter element 11 provides a conical shape like a plug-inn or rear insert and will be described in more detail with reference to FIG. 3.

Figure 3:
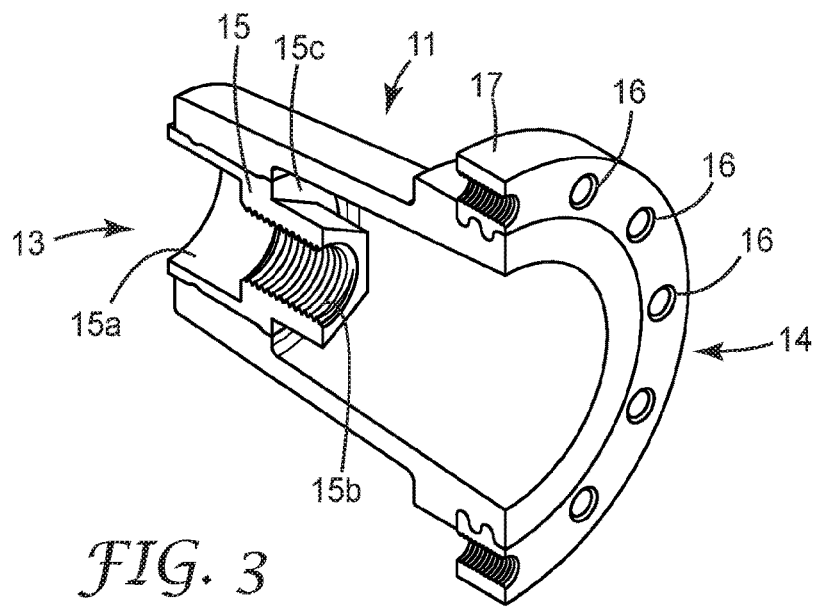
FIG. 3 is a three dimensional cross-section of an adapter element of the sensor of FIG. 1.

FIG. 3 is a three dimensional cross-section of the adapter element 11 of the sensors of FIG. 1. It provides a conical shape that is adapted in its size and shape to the size and shape of the cavity of the second extension 5 of the separable connector 2. The adaptor element 11 is further hollow with a front end 13 and a rear end 14. In a mounted state of the sensor, the front end 13 of the adapter element 11 faces the separable connector 2 and the rear end 14 faces the sensor body 12. The front end 13 of the adapter element 11 provides a metal part 15 being adapted in shape and size to receive the connection element 9 of the separable connector 2. The metal part 15 is configured to be used as a high voltage connection. It therefore comprises a non-threaded cylindrical portion 15*a* and threaded cylindrical portion 15*b*. The threaded cylindrical portion 15*b* may be threaded onto the connection element 8. The threaded cylindrical portion 15*b* may also provide a hexagonally shaped portion for receiving a complementary tool for mounting the adapter element 11 into the separable connector 2. The metal part 15 may further provide a contact area 15*c* which extends perpendicular to the threaded cylindrical portion 15*b*. In an installed state the contact area 15*c* gets in touch with a conductor 21 of the sensor body as will be described in more detail below and will enable a transfer of a voltage through the adapter 2 to the sensor body 3.

The metal part 15 needs to be electrically conductive so that it can transfer a voltage from the conductor 7 of the HV/MV voltage power network to the sensor 3 of the invention. It may also be made out of another material then metal as long as it is electrically conductive or provides a path from the separable connector to the sensor out of electrically conductive material. The rear end 14 of the adapter element 11 provides a ring 17 with multiple holes 16 for receiving fastening means to connect the sensor body 12 to the adapter element 11. The holes 16 all have the same diameter and the same distance from each other. The holes 16 may provide a thread for interacting with a screw. The ring 17 may be made out of metal or any other suitable material that is rigid enough to reliably establish the connection to the sensor body 12. The rest of the adapter element 11 is made out of an insulating material providing the above described conical and hollow shape. The insulating material may be rigid.

The adapter element 11 may be mounted very easily to the separable connector 2 into the cavity of the first extension 4 by rotating it, e.g. with the help of a hexagonally shaped tool, around the metal connection element 8 thereby threading the adapter 11 onto the metal connection element 8. As already outlined above, since the adapter element comprises a limited extension, it is possible to mount it by rotating it. This is not the case for the sensor body with an elongated extension. A rigid adapter element 11 can be mounted into the extension 5 of the separable connector 2 without any gaps that may entrap any air because the separable connector 2 provides some flexibility to adapt its shape around the shape of the adaptor element 11.

Figure 4:
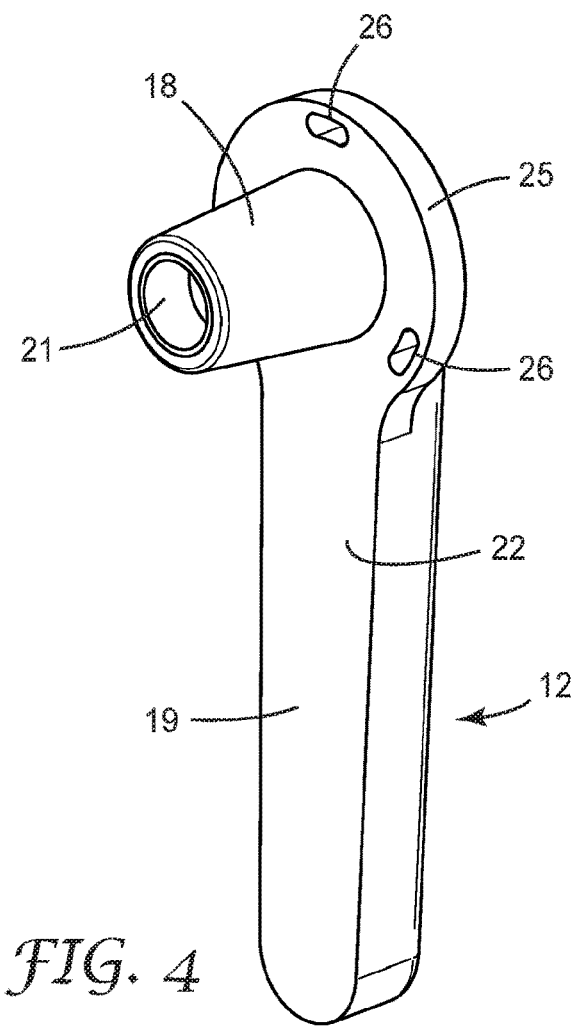
FIG. 4 is a three dimensional view of a sensor body of the sensor of FIG. 1.

As can be seen in FIG. 4 the sensor body 12 comprises a plug-in portion 18 and an elongated handle portion 19. The plug-in portion 18 is shaped conically as well and it is adapted in its size to the hollow space inside of the adapter element 11. It may provide a surface that is flexible to provide an easy installation of the sensor body 12 on the adapter element 11 that does not enclose any air. The plug-in portion 18 of the sensor body 12 further provides a conductor 21 for making an electrical connection to the metal part 15, especially the contact area 15c of the metal part 15 of the adapter element 11. The conductor 21 of the sensor body 12 may provide a recess for receiving the metal part 15 of the adapter element 11. The sensor body 3 further comprises an insulating element 22 carrying the conductor 21. The insulating element 22 may be rigid. In order to provide a flexible plug-in portion 18 it may be surrounded by a layer 23 of a flexible material.

The insulating element 22 may also extend into the handle portion 19 of the sensor body 12. It may also build the handle portion 19. The handle portion 19 is elongated and it extends approximately perpendicular to the plug-in portion 18 of the sensor body 12. The handle portion 19 carries a divider assembly 24 with a plurality of discrete impedance elements, which are electrically connected in series such as to be operable as a voltage divider for sensing a voltage, which is electrically connected to the conductor 21 of the sensor body 12 (see FIG. 6). The discrete impedance elements may for example be arranged on a PCB.

Where the plug-in portion 18 meets the handle portion 19, the sensor body provides a circular ring section 25. The ring section 25 is adapted in its size and shape to the ring 17 of the adapter element 11. The ring section 25 provides through holes 26.

The entire handle portion 19 of the sensor body 12 may be shielded. The shielding is not shown in the drawings. It may be arranged as a thin layer of electrically conductive material extending on the outside of the handle portion 19 including the ring portion 25. The shielding may be connected to ground with any known means for connecting shielding to ground.

For installing the sensor, here connecting the sensor body 12 to the adapter element 11, the sensor body 12 may be inserted into the adapter element 11. As a second step the holes 16 of the ring 17 of the adapter element 11 may be brought in alignment with the through holes 26 of the ring segment 25 of the sensor body. The fact that there are multiple holes 16 in the ring 17 of the adapter element 11 provides the possibility of fixing the sensor body 12 in many different positions relative to the adapter element 11 which may be advantageous in an environment with limited space, like in a transformer or switchgear. The sensor body 12 may now be fixed to the adapter element 11 with the help of screws 27 being inserted into the through holes 26 of the sensor body 12 and being screwed in to the holes 16 of the adapter element 11. In the embodiment shown in FIG. 1 through 6 three screws 27 are used.

To enable an installation that can be done with one hand only, the through holes 26 may be shaped like a pear with one end having an extended radius and one end having a smaller radius (not shown in the drawings). The extended radius needs to be large enough to receive the head of one of the screws 27. The smaller radius needs to be small enough to keep one of the heads of the screws 27. With such a configuration, it is possible to first insert screws 27 into the holes 16 of the adapter. Afterwards, the sensor body 12 is inserted into the adapter, thereby positioning the sensor body 12 such that the extended radius of the through holes 26 is positioned next to the head of the screws 27 and such that the sensor body 12 can be pushed over the head of the screws 27. After the sensor body 12 has been pushed over the head of the screws 27 it is rotated such that the screws rest in the smaller section of the through holes 26.

Figure 5:
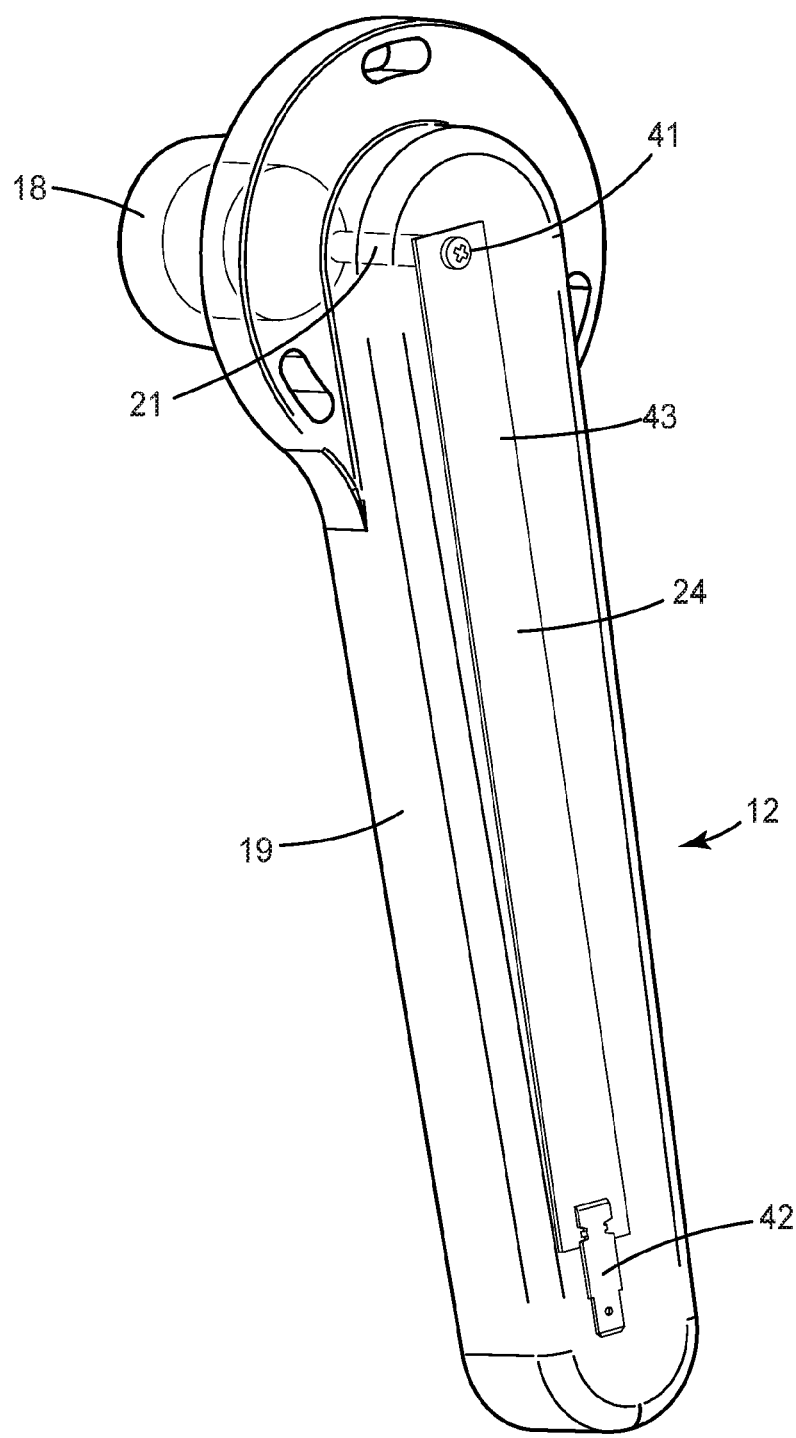
FIG. 5 is a three dimensional view of the sensor body of the sensor of FIG. 1 with a divider assembly.

FIG. 5 shows a three-dimensional view of a sensor body 12 of the sensor 3 according to the invention with a divider assembly arranged inside of the sensor body 12. As already pointed out above, the sensor body 12 comprises a plug-in portion 18 and an elongated handle portion 19. The plug-in portion 18 carries the conductor 21 that makes mechanical and electrical contact to the metal part 15 of the adapter element 11 and that is dimensioned such to be able to carry high voltage from the separable connector. The conductor 21 is connected with a high voltage end of the divider assembly 24 via a screw 41. Other mechanical fastening means can be used as well, such as bolts, rivets, threads, nuts etc. The electrical connection may be realised for example by a contact area (not shown) on the side of the divider assembly that faces the conductor 21. By connecting the conductor 21 with the divider assembly via the screw 41, the contact area gets in contact with the conductor 21 and thereby is able to transfer a voltage. The elongated handle portion 19 carries the divider assembly with a plurality of discrete impedance elements (not shown in the drawings) that may be arranged on a PCB 24. On the side that is opposite of the high voltage end of the divider assembly 24 a low voltage connection element 42 is provided. The low voltage connection element 42 may be arranged such that it extends out of the sensor body 12. It may be electrically connected to ground with any of the know connection means. The sensor body 12 may also provide an additional exit carrying the signal necessary for measuring the voltage. This signal may for example be transferred from the sensor body 12 to a RTU (remote terminal unit) via a low voltage cable. The RTU may transform the low voltage signal from the sensor body 12 into a value that corresponds to the high voltage in the separable connector 2.

Figure 6:
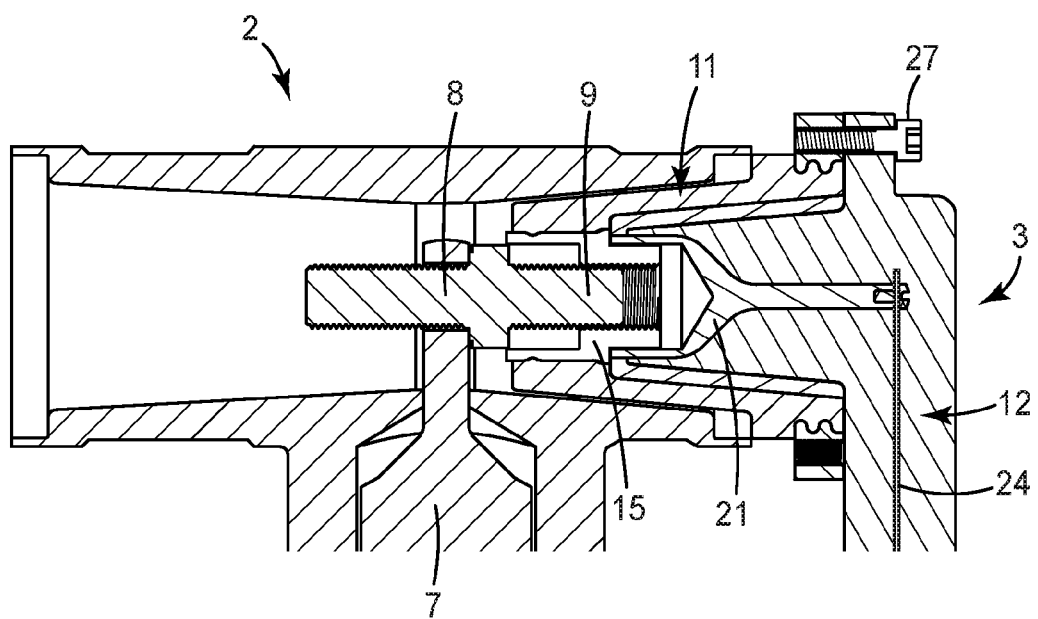
FIG. 6 is a cross-sectional view of a separable connector with the sensor of FIG. 1 mounted therein.

In FIG. 6, which is a cross-sectional view of a separable connector 2 with the sensor 3, the sensor 3 for measuring a voltage in a HV/MV power network according to the invention inserted into a separable connector 2 can be seen in a mounted state. The separable connector 2, which is a t-body, comprises a bolt like metal connection element 8 that is in electrical contact with the end of a conductor 7 of a HV/MV power network. The sensor 3 with its adapter element 11 and its sensor body 12 are mounted to the separable connector 2. The adapter element 11 is threaded with its metal part 15 onto the connection element 8. The outer surface of the adapter element 11 is fully aligned with the inner surface of the cavity of the first extension 5 of the separable connector 2. The sensor body 12 is fully inserted into the adapter element 11 thereby also aligning the interface or two contacting surfaces of sensor body 12 and adapter element 11. The sensor body 12 is fixed at the adapter element 11 through screws 27, one of which can be seen in FIG. 6. The conductor 21 of the sensor element 12 is in mechanical and electrical connection with the metal part 15 of the adapter element 11, thereby being electrically connected to the conductor 7 of the HV/MV power network. The sensor body 12 further carries the divider assembly 24 with a plurality of discrete impedance elements, which are electrically connected in series such as to be operable as a voltage divider for sensing a voltage. The divider assembly is electrically connected through the conductor 21 with the conductor of the HV/MV power network.

Figure 7:
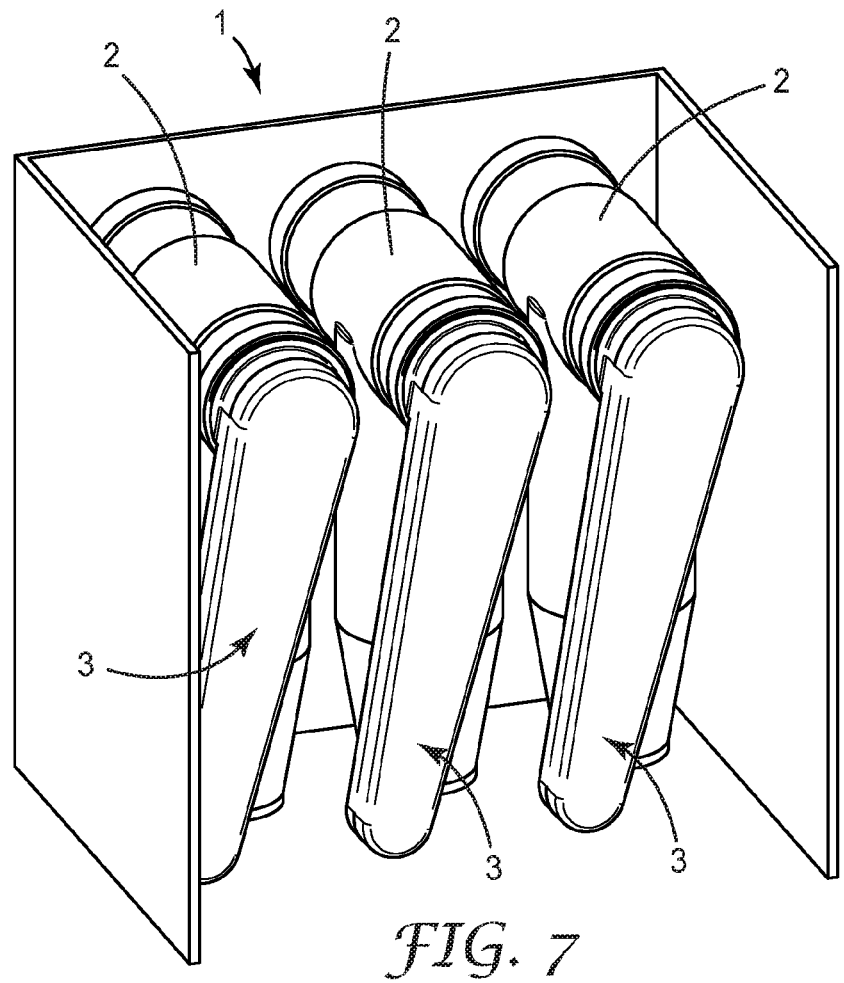
FIG. 7 is a three dimensional view of a three separable connectors in a chamber of a transformer or switchgear with another embodiment of a sensor for measuring a voltage in a HV/MV power network according to the invention.

FIG. 7 schematically shows a chamber 1 of a transformer or switchgear with three separable connectors 2. The separable connectors 2 are t-bodies providing one extension for receiving a conductor of a high voltage/medium (HV/MV) voltage power network as well as two additional extensions, one for receiving a sensor 3. The three sensors 3 provide a plug-in portion together with an elongated handle portion as will be explained in more detail with reference to FIGS. 9 to 14.

Figure 8:
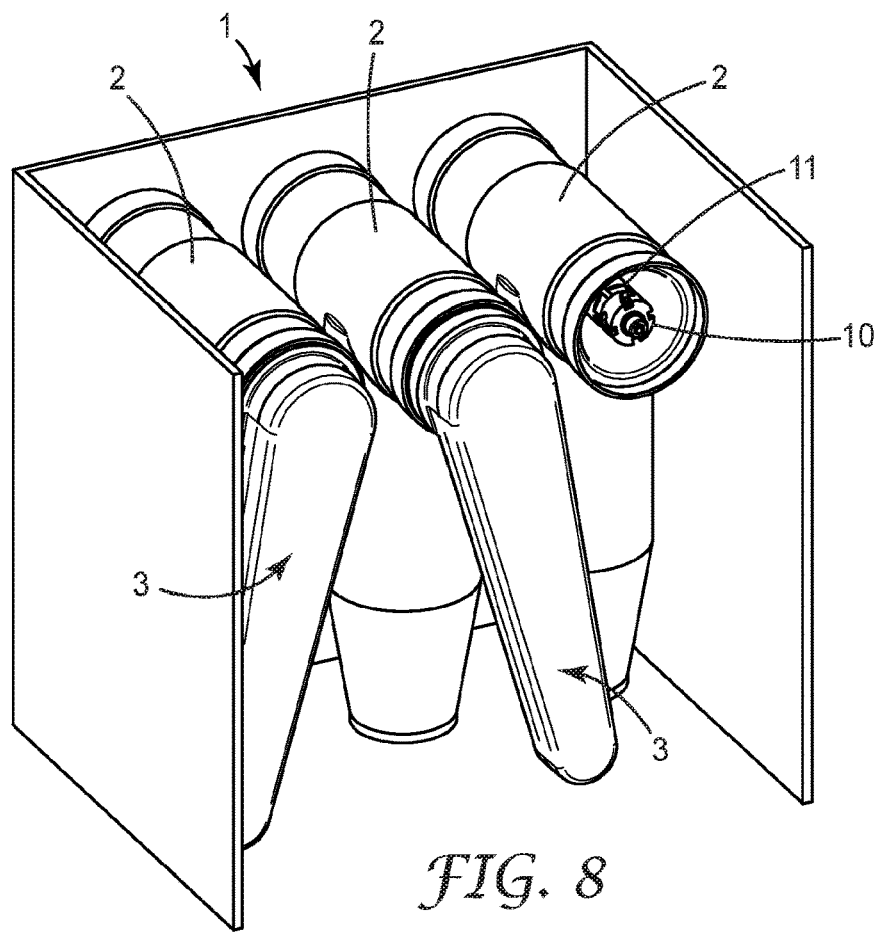
FIG. 8 is a three dimensional view of the transformer or switchgear of FIG. 7 with one sensor body being removed.

FIG. 8 schematically shows the chamber 1 of FIG. 1 with one sensor 3 being partially removed, the sensor body 12 of the sensor 3 is being removed. With a cavity of the separable connector an adapter element 11 together with a bayonet base 10 can be seen.

Figure 9:
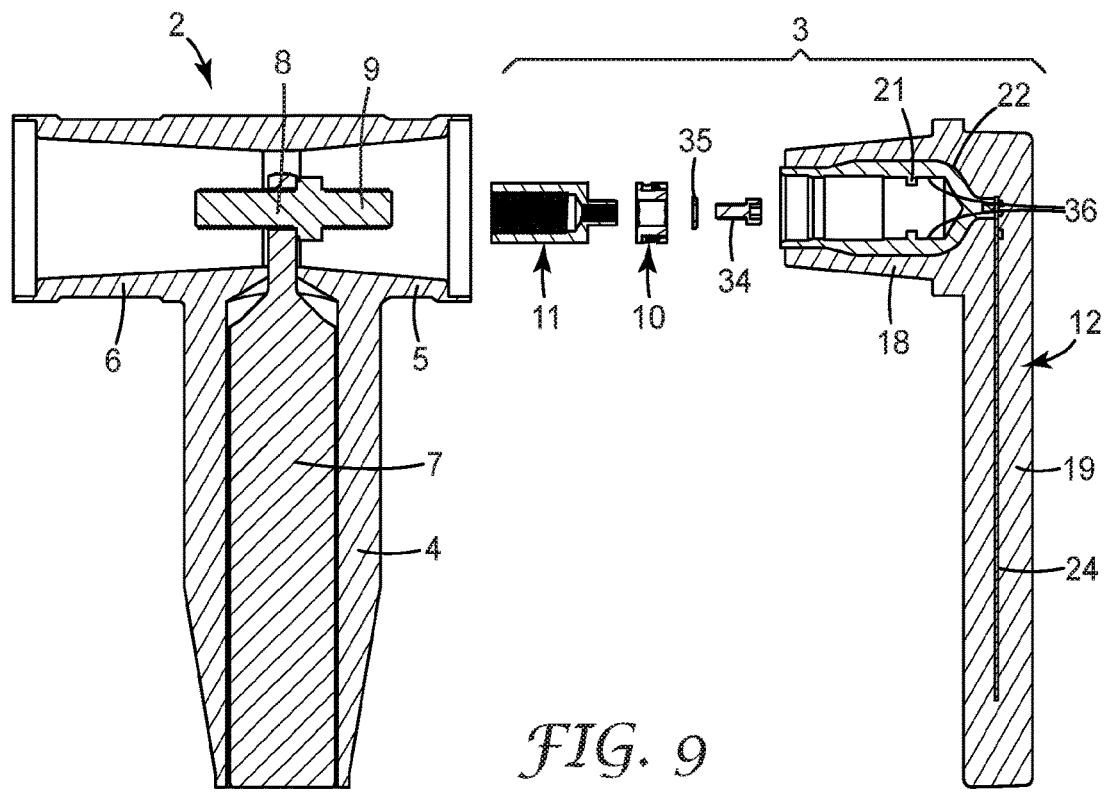
FIG. 9 is an exploded cross-sectional view of a separable connector together with the sensor of FIG. 7.

FIG. 9 shows an exploded cross-sectional view of a separable connector 2 together with a sensor 3 as shown in FIGS. 6 and 7. The separable connector 2 is a t-body with a first extension 4 with a cavity for receiving a conductor 7 of a HV/MV voltage power network. The conductor 7 is only shown schematically in FIG. 9. It makes electrical and mechanical connection to a metal connection element 8. The metal connection element 8 provides at least one threaded end 9. The separable connector 2 also provides a second extension 5 with a cavity for receiving a plug or rear insert. The threaded end 9 of the connection element 8 is arranged in the extension 5. The second extension 5 can be used for receiving a sensor 3 according to the invention. The separable connector 2 finally provides a third extension 6 with a cavity for receiving an a bushing from the transformer or switchgear).

Figure 10:
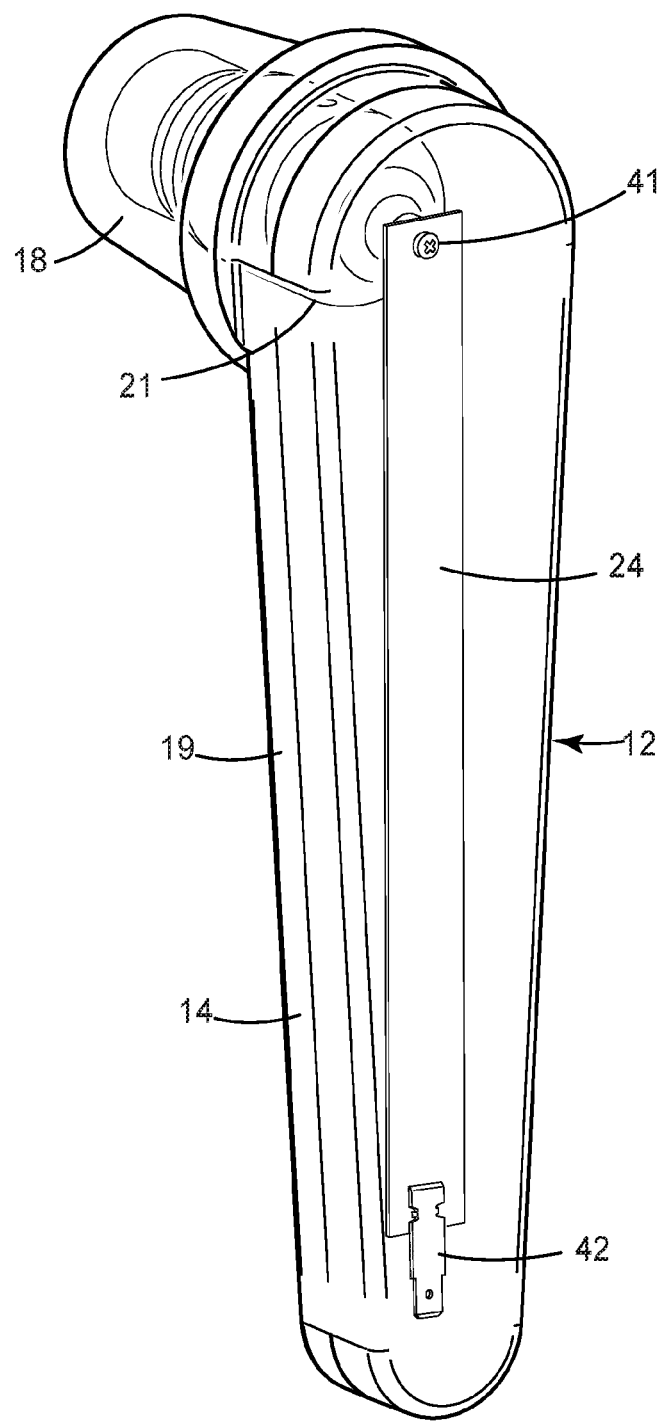
FIG. 10 is a three dimensional view of a sensor body of the sensor of FIG. 7 with a divider assembly.

In FIG. 10, is a three dimensional view of a sensor body 12 of the sensor 3 according to the invention with a divider assembly arranged inside of the sensor body 12. As already pointed out above, the sensor body 12 comprises a plug-in portion 18 and an elongated handle portion 19. The plug-in portion 18 carries the conductor 21 that makes mechanical and electrical connection to the adapter element 11 and the bayonet base 10, wherein the conductor 21 of the sensor body 12 is dimensioned such to be able to carry high voltage from the separable connector 2. The conductor 21 is connected with a high voltage end of the divider assembly 24 via a screw 41. Other mechanical fastening means can be used as well, such as bolts, rivets, threads, nuts etc. The electrical connection may be realised for example by a contact area (not shown) on the side of the divider assembly that faces the conductor 21. By connecting the conductor 21 with the divider assembly via the screw 41, the contact area gets in contact with the conductor 21 and thereby is able to transfer a voltage. The elongated handle portion 19 carries the divider assembly 24 with a plurality of discrete impedance elements (not shown in the drawings). On the side that is opposite of the high voltage end of the divider assembly 24 a low voltage connection element 42 is provided. The low voltage connection element 42 may be arranged such that it extends out of the sensor body 12. It may be electrically connected to ground with any of the know connection means. The sensor body 12 may also provide an additional exit carrying the signal necessary for measuring the voltage. This signal may for example be transferred from the sensor body 12 to a RTU (remote terminal unit) via a low voltage cable. The RTU may transform the low voltage signal from the sensor body 12 into a value that corresponds to the high voltage in the separable connector 2.

The entire handle portion 19 of the sensor body 12 may be shielded. The shielding is not shown in the drawings. It may be arranged as a thin layer of electrically conductive material extending on the outside of the handle portion 19. The shielding may be connected to ground with any known means for connecting shielding to ground.

The sensor 3 according to the embodiment shown in FIGS. 7 and 8 provides an adapter element 11, a bayonet base 10 and a sensor body 12. The adaptor element 11, the bayonet base 10 and the sensor body 12 are three separate elements that are adapted to be installed to the separable connector 2 wherein the adapter element 11 is configured to be installed between the separable connector 2 and the sensor body 12. The adapter element 11 provides a cylindrical shape with a through hole. The adapter element provides two different diameters. The portion of the adapter element 11 being directed towards the separable connector 2 provides a larger diameter than the portion of the adapter element 11 being directed towards the sensor body 12. The through hole is threaded at both ends of the adapter element 11. The portion facing the separable connector 2 is sized to house the threaded end 9 of the connection element 8. The portion facing the sensor body 12 is sized to house a screw for fixing the bayonet base 10 to the adapter element 11. The adapter element will now be described in more detail with reference to FIG. 13.

Figure 13:
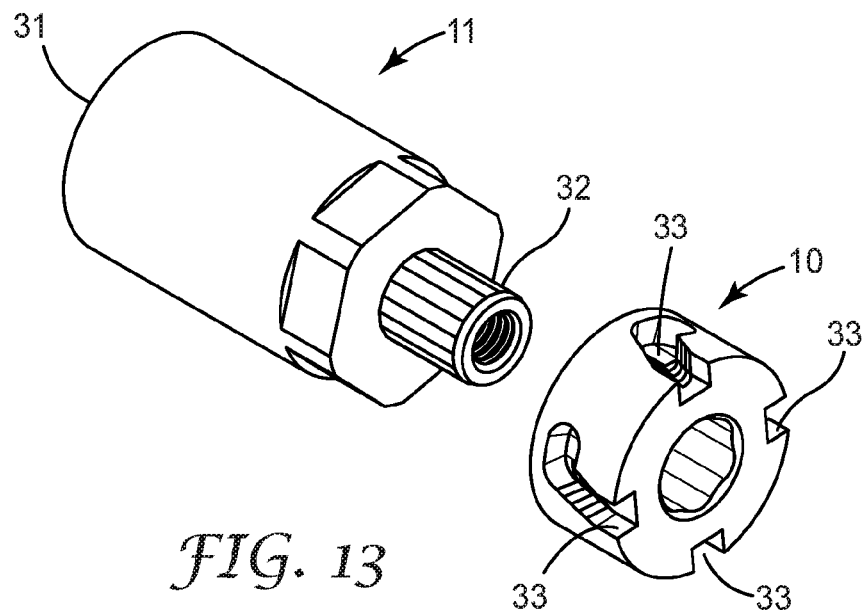
FIG. 13 is an exploded cross-sectional view of an adapter element and a bayonet base of the sensor of FIG. 7

FIG. 13 is a three dimensional exploded view of the adapter element 11 and the bayonet base 10 of the sensors of FIGS. 7 and 8. As already pointed out above, the adapter element 11 provides a cylindrical shape with a larger end 31 and a thinner end 32. The larger end 31 is designed to face the separable connector 2. It has a threaded through hole (not shown in FIG. 11) and an even outer surface. The thinner end 32 of the adapter element provides a threaded through hole as well and a multisided outer surface (multisided pin). At the end of the larger end 31 being directed towards the thinner end 32, the adapter element 11 provides a hexagonally shaped area for receiving a tool for fixing (rotating) the adapter element 11 onto the threaded part 9 of the connection element 8.

The adapter element may be mounted very easily to the separable connector 2 into the cavity of the first extension 4 by rotating it around the metal connection element 8 thereby threading the adapter 11 onto the metal connection element 8.

The bayonet base 10 is also a cylindrical element with a through hole. The through hole of the bayonet base 10 provides a multisided surface for receiving the multisided pin 32 of the adapter element 11. By providing a multisided through hole and a multisided pin 32, a relative rotation between the adapter element 11 and the bayonet base 10 is prohibited. The bayonet base 10 further provides four bayonet slots 33. The bayonet slots are L-shaped with a long slot section extending in an axial direction on the surface of the bayonet base 10 and a short slot section extending in a direction perpendicular to the axial direction.

Figure 11:
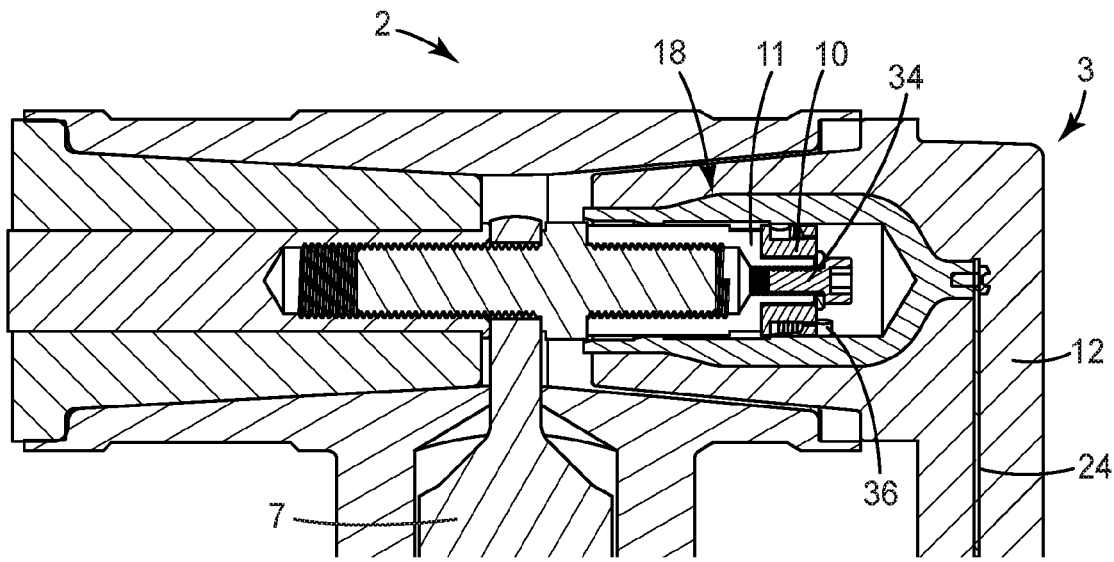
FIG. 11 is a cross-sectional view of a separable connector with the sensor of FIG. 7 being mounted therein—a sensor body not yet being finally connected to a bayonet base.
Figure 12:
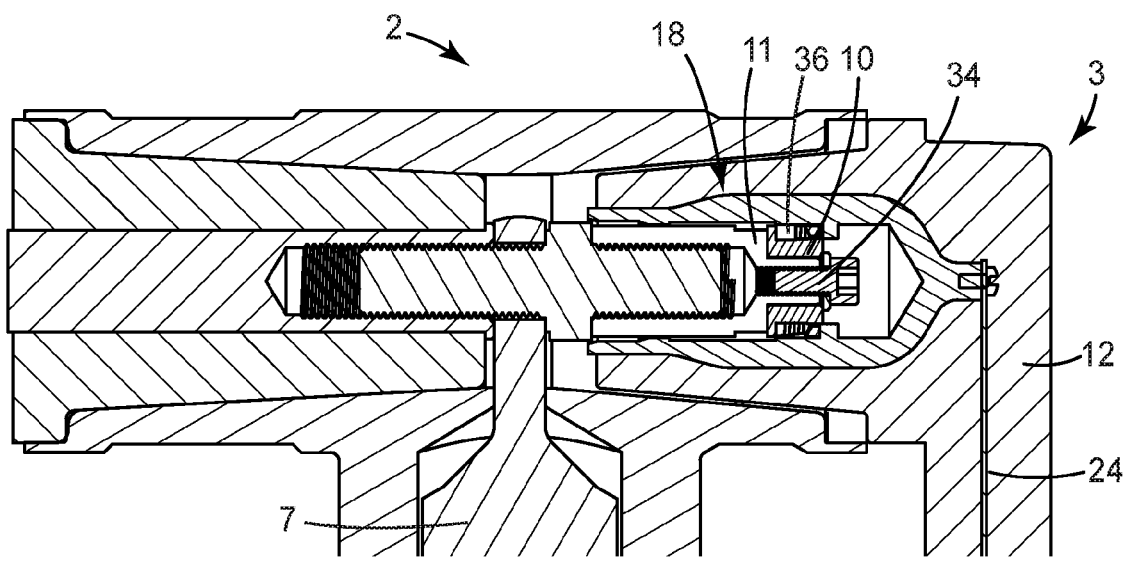
FIG. 12 is a cross-sectional view of a separable connector with the sensor of FIG. 7 mounted therein.

Mounting of the bayonet base 10 onto the adapter element 11 is done with the help of a screw 34 and a washer 35 as can be seen in the FIGS. 9, 11 and 12. Alternative mounting means are possible as well, such as for example bolts, nuts, rivets, snap fit or clamping solutions.

Figure 14:
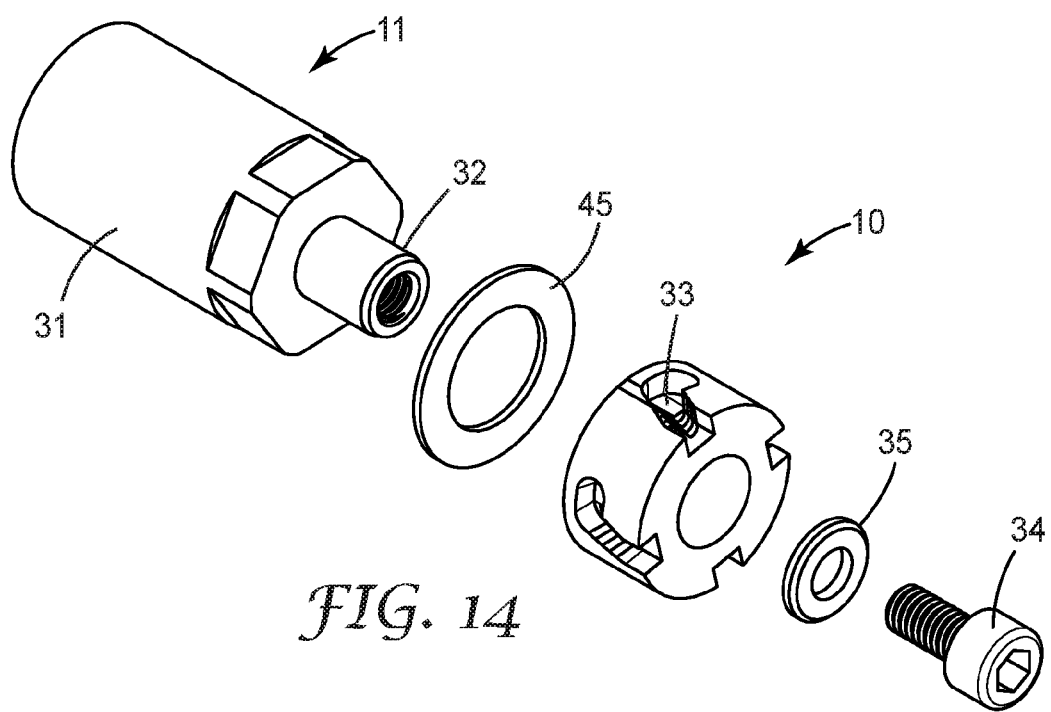
FIG. 14 is an exploded cross-sectional view of an adapter element and a bayonet base of the sensor of FIG. 7 and FIG. 15 a side view of the sensor body of the sensor of FIG. 7 onto the side facing the separable connector in a mounted state showing bayonet pins.
Figure 15:
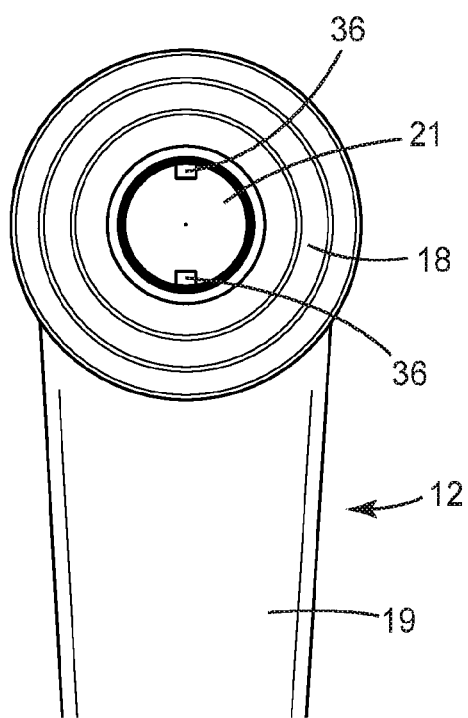

FIG. 14 is a three dimensional exploded view of another embodiment of the adapter element 11 and a bayonet base 10. The adapter element 11 provides a cylindrical shape with a larger end 31 and a thinner end 32. The larger end 31 is designed to face the separable connector 2. It has an even outer surface. The thinner end 32 of the adapter element provides a threaded through hole. Different from the embodiment shown in FIG. 13 it also provides an even surface. At the end of the larger end 31 being directed towards the thinner end 32, the adapter element 11 provides a hexagonally shaped area for receiving a tool for fixing (rotating) the adapter element 11 onto the threaded part 9 of the connection element 8.

The adapter element may be mounted very easily to the separable connector 2 into the cavity of the first extension 4 by rotating it around the metal connection element 8 thereby threading the adapter 11 onto the metal connection element 8.

The bayonet base 10 is also a cylindrical element with a through hole. The through hole of the bayonet base 10 is even—again different from the embodiment shown in FIG. 13. In order to prohibit a relative rotation between the adapter element 11 and the bayonet base 10 and additional element a friction shim 45 is provided. The friction shim 45 is a flat washer with a steel core and small diamonds embedded in a nickel layer on both sides. The friction shim 45 increases the coefficient of friction between the bayonet base 10 and the adapter element 11 significantly while maintaining the torque of the screw.

The bayonet base 10 further provides four bayonet slots 33. The bayonet slots 33 are L-shaped with a long slot section extending in an axial direction on the surface of the bayonet base 10 and a short slot section extending in a direction perpendicular to the axial direction.

Mounting of the bayonet base 10 onto the adapter element 11 is done with the help of a screw 34 and a washer 35 as also can be seen in the FIGS. 9, 11 and 12. Alternative mounting means are possible as well, such as for example bolts, nuts, rivets, snap fit or clamping solutions.

As can be seen for example in FIG. 9 the sensor body 12 comprises a plug-in portion 18 and an elongated handle portion 19. The plug-in portion 18 is shaped conically and it is adapted in its size to the cavity of the first extension 5 of the separable connector 2. The plug-in portion 18 of the sensor body 12 further provides a conductor 21 for making mechanical and electrical connection to the bayonet base 10 and the adapter element 11. The conductor 21 provides a cylindrical shape with a recess for receiving the adapter element 11 and the bayonet base 10. The recess further provides bayonet pins 36 for engaging with the bayonet slots 33 of the bayonet base 10. The electrical connection may be established over the bayonet pins 36 of the conductor 21.

The insulating element 22 may also extend into the handle portion 19 of the sensor body 12. It may also build the handle portion 19. The handle portion 19 is elongated and it extends approximately perpendicular to the plug-in portion 18 of the sensor body 12. The handle portion 19 carries a divider assembly 24 with a plurality of discrete impedance elements, which are electrically connected in series such as to be operable as a voltage divider for sensing a voltage, which is electrically connected to the conductor 21 of the sensor body 12.

For installing the sensor 3, here connecting the sensor body 12 to the adapter element 11 and the bayonet base 10, the sensor body 12 may be inserted into the cavity of the first extension of the separable connector 2 until the bayonet pins 36 contact the bayonet base 10. When rotating the sensor body 12 relative to the adapter element 11 with the bayonet base 10, the bayonet pins 36 will reach a position where the bayonet slots 34 begin. In this position it is possible to further move the sensor body 12 into the separable connector 2 until the bayonet pins 36 reach the end of the long slot section of the bayonet slot 33. Through rotating the sensor body 12 relative to the separable connector 2, the sensor body 12 gets fixed onto the adapter element 11 and therewith the sensor 3 into the separable connector 2. Through the material combination flexible from the extension 5 of the separable connector 2 and rigid from the plug-in portion of the sensor body 3 a force may be generated, that pushes the sensor body 3 out of the extension 5 against the short slot section of the bayonet slot 33. Such an installation is easy and can be done with one hand only. The material combination also helps to avoid that air is being entrapped between the surfaces of the separable connector 2 and the plug-in portion 18 of the sensor body 3.

In FIGS. 11 and 12, which is cross-sectional view of a separable connector 2 with the sensor 3, the sensor 3 for measuring a voltage in a HV/MV power network in a separable connector 2 according to the invention can be seen in an almost mounted and in a mounted state. The separable connector 2, which is a t-body, comprises a bolt like metal connection element 8 that is in electrical contact with the end of a conductor 7 of a HV/MV power network. The sensor 3 with its adapter element 11, the bayonet base 10 and its sensor body 12 are mounted to the separable connector 2. The adapter element 11 is threaded onto the connection element 8 of the separable connector 2. The bayonet base 10 is mounted onto the adapter element 11 with the help of the screw 34. In FIG. 11, the sensor body 12 is inserted into the separable connector 2 until the bayonet pins 36 touch the bayonet base 10. In FIG. 12, the sensor body 12 is further inserted into the separable connector 2 with the bayonet pins 36 being fully moved inside of the according bayonet slots 33 in the bayonet base 10.

When the sensor body 12 is fully inserted into the separable connector 2 the two contacting surfaces of sensor body 12 and separable element fully align with each other so that now air is being entrapped. The conductor 21 of the sensor element 12 is in mechanical and electrical connection with the adapter element 11, thereby being electrically connected to the conductor 7 of the HV/MV power network. The sensor body 12 further carries the divider assembly 24 with a plurality of discrete impedance elements 24, which are electrically connected in series such as to be operable as a voltage divider for sensing a voltage. The divider assembly is electrically connected through the conductor 21 with the conductor of the HV/MV power network.

FIG. 14 is a side view of the sensor body of the sensor of FIG. 7 onto and into the plug-in portion 18 showing the conductor 21 with two bayonet pins 36 being arranged on opposite sides of the conductor 21.

The invention claimed is:

1. Sensor for measuring a voltage in a HV/MV power network in a separable connector, the sensor comprising:
an adapter element comprising a high voltage connection adapted to be mechanically and electrically coupled to a high voltage conductor of the separable connector and to receive HV/MV voltage from the separable connector;
a sensor body adapted to be mechanically and electrically coupled to the adapter element and comprising a divider assembly with a plurality of discrete impedance elements, which are electrically connected in series such as to be operable as a voltage divider for sensing a voltage and a low voltage connection configured to provide a low voltage signal corresponding to a high voltage signal present in the HV/MV power network;
wherein the adapter element and the sensor body are separate elements that are adapted to be installed to the separable connector, wherein the adapter element is configured to be installed between the separable connector and the sensor body, and wherein the adapter element comprises an insulating element, which is sized and shaped such as to fit into a recess of the separable connector.

2. Sensor for measuring a voltage according to claim 1, wherein the sensor comprises an insulating material and wherein the sensor is configured to be inserted into the separable connector to encase the high voltage conductor of the separable connector.

3. Sensor for measuring a voltage according to claim 1, wherein the adapter element comprises a metal part for making electrical and mechanical connection to the high voltage conductor of the separable connector.

4. Sensor for measuring a voltage according to claim 3, wherein the adapter element comprises a thread for being threaded onto or into the high voltage conductor of the separable connector and/or a protrusion for cooperating with any kind of tool for threading the adapter element onto or into the separable connector.

5. Sensor for measuring a voltage according to claim 1, wherein the adapter element comprises means for mechanically and electrically connecting the adapter element to the sensor body.

6. Sensor for measuring a voltage according to claim 1, wherein the sensor body comprises a conductor that is adapted to be mechanically and electrically coupled to a metal part of the adapter element.

7. Sensor for measuring a voltage according to claim 1, wherein the sensor body comprises an insulating element carrying a conductor as well as the divider assembly.

8. Sensor for measuring a voltage according to claim 1, wherein the sensor body provides an elongated handle portion.

9. Sensor for measuring a voltage according to claim 8, wherein the handle portion of the sensor body holds the divider assembly.

10. Sensor for measuring a voltage according to claim 1, wherein the sensor body comprise means for mechanically connecting the sensor body to the adapter element.

11. Power network comprising a HV/MV power conductor, a separable connector and a sensor according to claim 1.

12. Sensor for measuring a voltage in a HV/MV power network in a separable connector, the sensor comprising:
an adapter element comprising a high voltage connection adapted to be mechanically and electrically coupled to a high voltage conductor of the separable connector and to receive HV/MV voltage from the separable connector;
a sensor body adapted to be mechanically and electrically coupled to the adapter element and comprising a divider assembly with a plurality of discrete impedance elements, which are electrically connected in series such as to be operable as a voltage divider for sensing a voltage and a low voltage connection configured to provide a low voltage signal corresponding to a high voltage signal present in the HV/MV power network;
wherein the adapter element and the sensor body are separate elements that are adapted to be installed to the separable connector, wherein the adapter element is configured to be installed between the separable connector and the sensor body, wherein the sensor body comprises an insulating element, wherein the insulating element of the sensor body comprises an outer elastic surface adapted in size and shape to a contacting surface of the adapter element and/or the separable connector.

13. Power network comprising a HV/MV power conductor, a separable connector and a sensor according to claim 12.

14. Sensor for measuring a voltage in a HV/MV power network in a separable connector, the sensor comprising:
an adapter element comprising a high voltage connection adapted to be mechanically and electrically coupled to a high voltage conductor of the separable connector and to receive HV/MV voltage from the separable connector;
a sensor body adapted to be mechanically and electrically coupled to the adapter element and comprising a divider assembly with a plurality of discrete impedance elements, which are electrically connected in series such as to be operable as a voltage divider for sensing a voltage and a low voltage connection configured to provide a low voltage signal corresponding to a high voltage signal present in the HV/MV power network;
wherein the adapter element and the sensor body are separate elements that are adapted to be installed to the separable connector, wherein the adapter element is configured to be installed between the separable connector and the sensor body, wherein the sensor comprises a bayonet base to be mounted on the adapter element, the bayonet base comprising bayonet slots.

15. Sensor for measuring a voltage according to claim 14, wherein the sensor body comprises pins for engaging with the bayonet base.

16. Sensor for measuring a voltage according to claim 14, wherein the adapter element comprises a multisided pin for engaging with a multisided hole in the bayonet base.

17. Power network comprising a HV/MV power conductor, a separable connector and a sensor according to claim 14.

* * * * *